United States Patent [19]

Tsujimura et al.

[11] Patent Number: 5,464,500
[45] Date of Patent: Nov. 7, 1995

[54] METHOD FOR TAPER ETCHING METAL

[75] Inventors: Takatoshi Tsujimura, Tokyo; Hiroaki Kitahara, Hachioji, both of Japan

[73] Assignee: International Business Machines Corporation, Armonk, N.Y.

[21] Appl. No.: 286,604

[22] Filed: Aug. 5, 1994

[30] Foreign Application Priority Data

Aug. 6, 1993 [JP] Japan .................................. 5-195663

[51] Int. Cl.⁶ ............................................................. C23F 1/00
[52] U.S. Cl. ....................................................................... 216/34
[58] Field of Search .................................... 156/656, 665, 156/664; 437/190, 192, 194

[56] References Cited

U.S. PATENT DOCUMENTS

| | | | |
|---|---|---|---|
| 3,700,508 | 10/1972 | Keen, Jr. ............................ | 156/656 X |
| 3,825,454 | 7/1974 | Kikuchi et al. ....................... | 156/656 |
| 4,610,502 | 9/1986 | Nicia et al. .......................... | 156/656 X |
| 5,007,984 | 4/1991 | Tsutsumi et al. ..................... | 156/656 |
| 5,118,385 | 6/1992 | Kumar et al. ........................ | 156/656 X |

*Primary Examiner*—Thi Dang
*Attorney, Agent, or Firm*—Robert M. Trepp

[57] ABSTRACT

A method for forming a tappered first metal wiring layer is described incorporating a substrate, a second metal layer formed as the upper layer on the first metal layer, a third metal layer having a diffusion coefficient lower than the diffusion coefficients of the above two metal layers formed between the first and the second metal layers, a resist pattern formed on the second metal layer, wherein the first metal layer is etched using the patterns of the second and the third metal layers and the resist pattern as etching masks to form a tapered cross-sectional pattern of the first metal wiring layer.

8 Claims, 4 Drawing Sheets

METHOD FOR TAPER ETCHING METAL

FIELD OF THE INVENTION

This invention relates to a method for taper etching metal, and more particularly, to etching a metal wiring layer pattern wherein metal leads have a tapered cross-sectional pattern. This invention is especially advantageous when applied to manufacturing processes for thin film transistor (TFT) liquid crystal panels or semiconductors which use metal, for example, aluminum wiring layers.

BACKGROUND OF THE INVENTION

An etching technique for forming a tappered metal layer is disclosed in PUPA 1-151236 (1989) which is more fully described in FIGS. 7–10 herein. Referring to FIGS. 7 through 10, cross-sectional diagrams are shown illustrating a method of the prior art for taper etching an aluminum layer in a sequence of steps.

As FIG. 7 shows, an aluminum layer 13 is formed on a substrate 11, and a molybdenum layer 14 is formed on the aluminum layer 13 using a thin film deposition method such as sputtering or evaporation. A photoresist 15 is applied on the molybdenum layer 14 to form a predetermined pattern. As FIG. 8 shows, when the substrate 11 is immersed in an etching solution consisting, for example, of phosphoric acid, nitric acid, and water, the molybdenum layer 14 is etched and the underlying aluminum layer 13 is exposed. On contacting the etching solution, the molybdenum layer 14 and the aluminum layer 13 are etched simultaneously, and the aluminum layer 13 is etched through the molybdenum layer 14 as a mask. At this time, since the molybdenum layer 14 has a higher etching rate than the aluminum layer 13, the cross-sectional pattern of the aluminum layer 13 becomes moderately tapered. Then, if the photoresist 15 is removed as shown in FIG. 9, the molybdenum layer 14 may be removed as FIG. 10 shows, molybdenum layer 14 may be etched off by dry etching to obtain the tapered pattern of the aluminum layer 13 on substrate 11.

Another etching technique of the prior art is disclosed in PUPA 61-77344 (1986), wherein the second thin film for example a W—Ti alloy film, Mo, other high-melting-point metals, or the alloys thereof is deposited on the first thin film of Al or of an Al—Si alloy film on which a tapered pattern is to be formed; a resist pattern is formed on the second thin film; and, when dry etching is performed using the second thin film as a mask, the edge of the second thin film is etched beyond the edge of the resist pattern. If dry etching is continued under different conditions, the second thin film functions as the second etching mask to form a tapered pattern on the sidewall of the first thin film.

In PUPA 1-95524 (1989), a method for forming a tapered cross-sectional pattern of a chromium film is disclosed. In this method, the first thin film of chromium is formed on a silicon substrate, the second thin film of aluminum or an aluminum alloy is formed on the first thin film, a desired resist pattern is formed on the second thin film, and the first and second thin films are etched using phosphoric acid to form a tapered cross-sectional pattern by the difference in etching rates of these layers.

In PUPA 3-263833 (1991), a method is disclosed in which a lower layer of gold is formed on an insulator substrate, an upper layer of gold having an etching rate higher than the lower layer is formed, a photoresist layer is formed on the upper layer, and the lower layer is tapered by wet etching.

All of the above prior art methods are directed to forming a tapered pattern on the sidewall of a lower layer having a lower etching rate than an upper layer by etching the lower and upper layers on a substrate. However, if the film growth temperature is high or the film growth time is long to form the layers, the diffusion length of metal ions composing the lower and upper layers increases making the diffusion of metals into each other occur easily, and an alloy is formed in the interface between the above metals.

Since an alloy has a different etching rate from the etching rate of the original metals, the alloy formed in the interface between the lower and upper layers may be etched faster, may be etched slower, or may be etched only a little. However, if the two layers and the alloy therebetween have different etching rates, taper etching, the object of this invention, cannot be achieved.

If an alloy layer having a lower etching rate is formed as granules in the interface between the lower and upper metal layers, the etchant permeates between the granules, removing the surrounding metal and forming vermicular defects 28 on metal wiring 23 on substrate 21 as shown in FIG. 11. These vermicular defects 28 increases the possibility of short-circuiting or open-circuiting due to the breaking of wires. Since the alloy has different sizes and forms depending on ambient factors such as temperature, the state of the interface between the two metal layers changes depending on the storage conditions of substrate 21, causing taper formation to be unstable.

SUMMARY OF THE INVENTION

In accordance with the present invention, a method for taper etching is described comprising the steps of forming a first metal layer on a substrate, forming a second metal layer on the first metal layer, forming a third metal layer having a diffusion coefficient lower than the diffusion coefficients of the first and second metal layers, said third metal layer formed between the first and second metal layers, forming a resist pattern on the second metal layer, and etching the first metal layer using the patterns of the second and third metal layers and the resist pattern as etching masks to form a tapered cross-sectional pattern of the first metal layer.

An object of this invention is to solve the problems in the prior art methods described above, to prevent vermicular defects from occurring in the wiring, and to provide a metal wiring layer with high manufacturing yield.

An object of this invention is to form a well-controlled, stable tapered cross-sectional pattern of a metal wiring layer.

According to the method described above, the formation of the alloy of the first and the second metals in the interface between the first lower metal layer and the second upper metal layer may be prevented. In addition, the first metal layer may be etched at a uniform rate.

BRIEF DESCRIPTION OF THE DRAWINGS

These and other features, objects, and advantages of the present invention will become apparent upon consideration of the following detailed description of the invention when read in conjunction with the drawing in which.

DESCRIPTION OF THE PREFERRED EMBODIMENT

Figure 1:
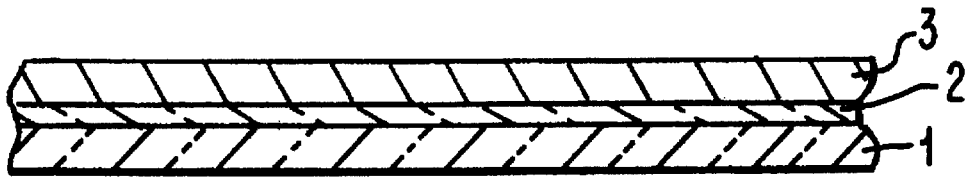
FIG. 1 shows a cross-sectional view of a substrate with layers illustrating step (1) of the method for taper etching according to this invention.

Referring now to the drawing, FIGS. 1 to 6 are cross-sectional views showing the steps of the method for taper etching according to this invention.

Figure 2:
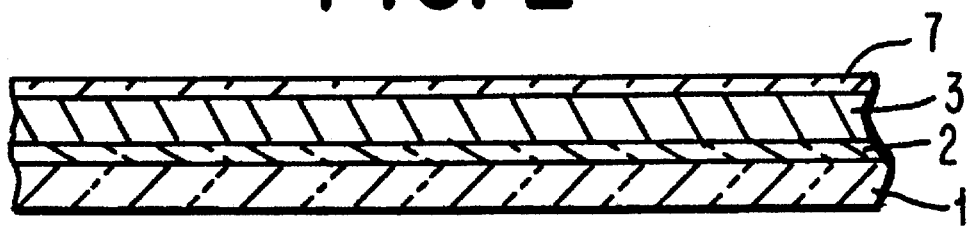
FIG. 2 shows a cross-sectional view of a substrate with layers illustrating step (2) of the method for taper etching according to this invention.

In FIG. 1, 1 is a substrate, for example, a glass substrate, 2 is a silicon oxide layer formed on the substrate 1, and 3 is an aluminum layer formed on the silicon oxide layer 2 to a thickness of 2000 angstroms by, for example, sputtering. Layer 3 may have a thickness in the range from 100 to 4000 angstroms. In FIG. 2, 7 is an aluminum oxide layer formed on the aluminum layer 3 having a thickness of 10 angstroms by heating the aluminum layer 3 to 200 C and exposing it to oxygen or air for 10 minutes. Layer 7 may have a thickness in the range from 5 to 120 angstroms.

Next, a molybdenum layer 4 having a thickness of 500 angstroms is formed on the aluminum oxide layer 7 by, for example, sputtering. Molybdenum layer 4 may have a thickness in the range from 25 to 4000 angstroms. By making the aluminum oxide layer 7 intervene between the aluminum layer 3 and the molybdenum layer 4, the diffusion of molybdenum into aluminum is prevented. Although an aluminum oxide layer is made to intervene between the aluminum layer, the lower metal layer, and the molybdenum layer, the upper metal layer in the above embodiment, the intervening layer is not limited to aluminum oxide but any metal may be used if its diffusion coefficient is smaller than that of the lower and the upper metal layers, for example, a barrier metal such as titanium may be used. Even if the aluminum oxide layer is present between the aluminum layer 3 and the molybdenum layer 4, the resistance between the aluminum layer 3 and the molybdenum layer 4 is so small as to raise no problems because the thickness of the aluminum oxide layer 7 is as thin as 10 angstroms.

Figure 3:
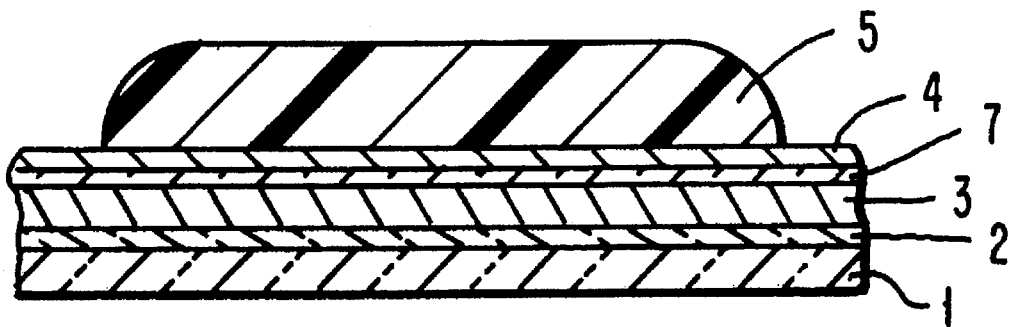
FIG. 3 shows a cross-sectional view of a substrate with layers illustrating step (3) of the method for taper etching according to this invention.

Next, as FIG. 3 shows, a resist pattern 5 is formed over the molybdenum layer. The edge of the resist pattern 5 is tapered because the resist pattern 5 is formed using a spin coater.

Figure 4:
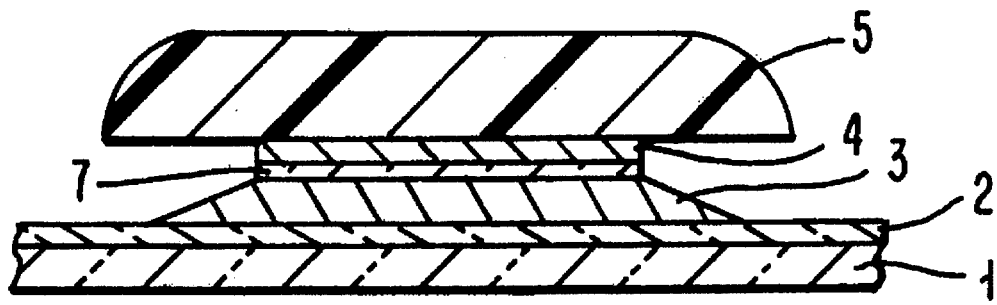
FIG. 4 shows a cross-sectional view of a substrate with layers illustrating step (4) of the method for taper etching according to this invention.

Next, aluminum layer 3, aluminum oxide layer 7 and molybdenum layer 4 on substrate 1 as shown in FIG. 3 are etched by immersing them in an etching solution consisting, for example, of phosphoric acid, nitric acid, acetic acid, and water. FIG. 4 shows the cross-sectional view after the step of etching. The part of the molybdenum layer 4 not coated with the resist pattern 5 is first etched, then the aluminum oxide mask 7 is etched. Then, the edges of the molybdenum layer 4 and the aluminum oxide layer 7 are also etched inward from the edge of the resist pattern 5 by side etching, and the underlying aluminum layer 3 is simultaneously etched through the molybdenum layer 4 and the aluminum oxide layer 7 functioning as masks. Since the aluminum layer 3 has an etching rate lower than the molybdenum layer 4 and the aluminum oxide layer 7, the cross section of the aluminum layer 3 is formed having a taper angle of 20 degrees with good repeatability.

Figure 5:
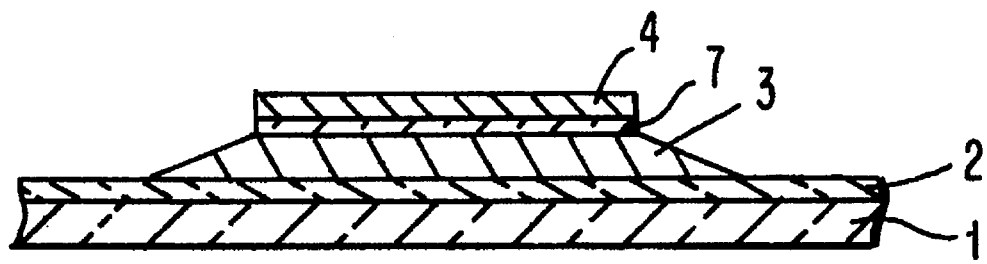
FIG. 5 shows a cross-sectional view of a substrate with layers illustrating step (5) of the method for taper etching according to this invention.
Figure 6:
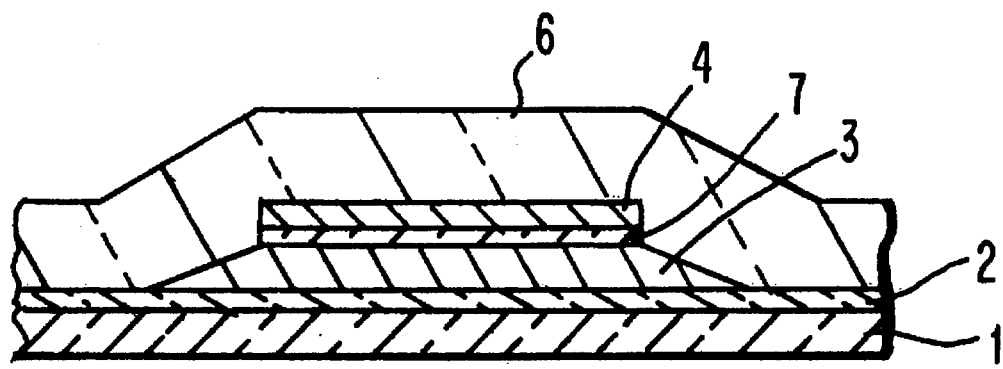
FIG. 6 shows a cross-sectional view of a substrate with layers illustrating step (6) of the method for taper etching according to this invention.
Figure 7:
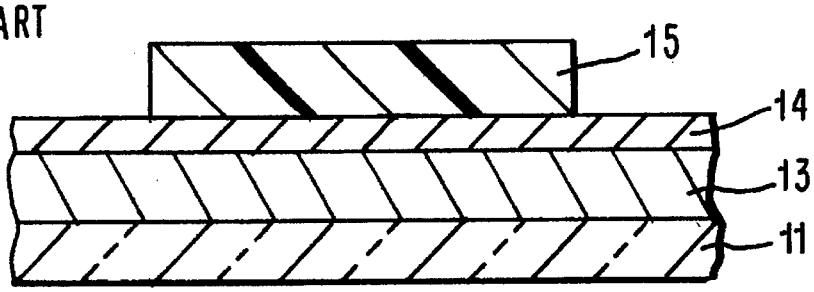
FIG. 7 shows a cross-sectional view of step (1) of a method for taper etching according to the prior art.
Figure 8:
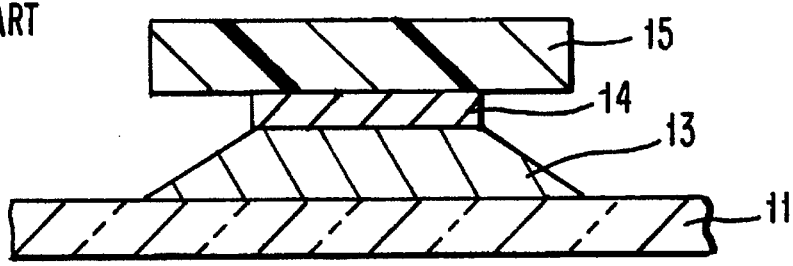
FIG. 8 shows a cross-sectional view of step (2) of a method for taper etching according to the prior art.
Figure 9:
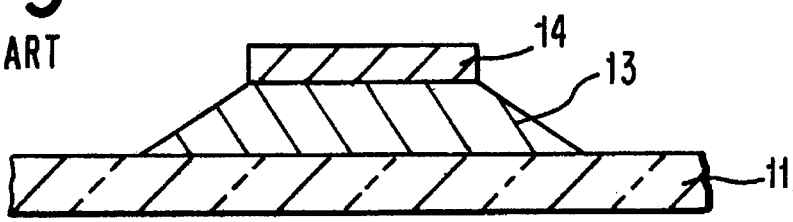
FIG. 9 shows a cross-sectional view of step (3) of a method for taper etching according to the prior art.
Figure 10:
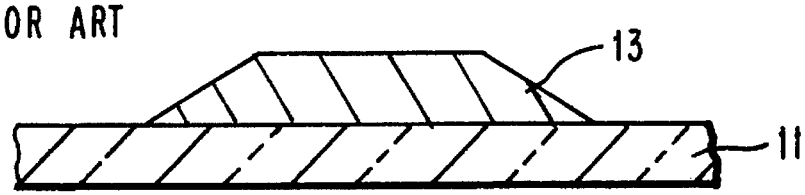
FIG. 10 shows a cross-sectional view of step (4) of a method for taper etching according to the prior art.
Figure 11:
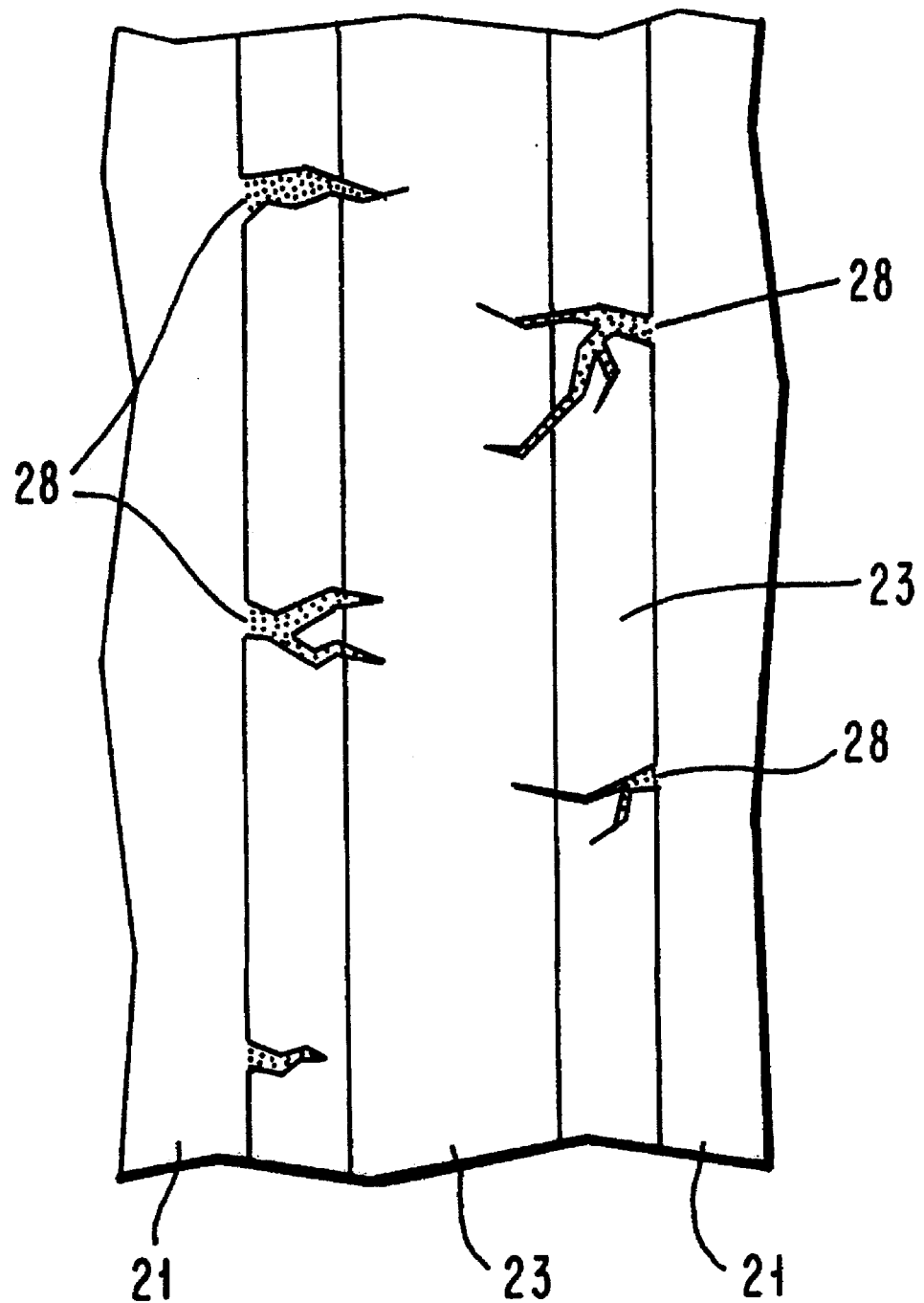
FIG. 11 shows a plan view of metal wiring illustrating the state where vermicular defects have occurred.

Next, as FIG. 5 shows, the resist pattern 5 is removed, and, as FIG. 6 shows, a silicon oxide layer 6 is deposited on the molybdenum layer 4, for example, by sputtering or chemical vapor deposition (CVD).

In the embodiment as described above, a glass substrate is used as substrate 1, but other materials such as a silicon substrate may also be used.

As embodiments of this invention other than the above embodiment of the three-layer structure consisting of aluminum/aluminum oxide/molybdenum, a three-layer structure consisting of aluminum/aluminum oxide/titanium from the bottom to the top, a three-layer structure consisting of chromium/chromium oxide/aluminum from the bottom to the top, and a four-layer structure consisting of molybdenum/aluminum/aluminum oxide/molybdenum laminated from the bottom to the top are also feasible.

According to this invention, since the formation of an alloy between lower and upper layers to be tapered is prevented, the occurrence of vermicular defects may be prevented, and in addition, the etching rate is made constant, stabilizing the formation of tapered patterns.

While there has been described and illustrated a method for taper etching metal, it will be apparent to those skilled in the art that modifications and variations are possible without deviating from the broad scope of the invention which shall be limited solely by the scope of the claims appended hereto.

Having thus described my invention, what I claim as new and desire to secure by Letters Patent is:

1. The method for taper etching comprising the steps of laminating a lower metal layer and an upper metal layer having an etching rate different from the etching rate of said lower metal layer on a substrate, forming a middle metal layer having a diffusion coefficient smaller than the diffusion coefficient of said lower and upper metal layers between said lower metal layer and said upper metal layer for preventing an alloy from forming between said lower and upper metal layers, and etching said upper middle and lower metal layer whereby a tapered pattern is formed on said lower metal layer, said lower metal layer is made of aluminum, said upper metal layer is made of molybdenum, and said middle metal layer is made of aluminum oxide.

2. The method for taper etching as set forth in claim 3 wherein said aluminum oxide layer has a thickness of about 10 angstroms.

3. The method for taper etching comprising the steps of laminating a lower metal layer and an upper metal layer having an etching rate different from the etching rate of said lower metal layer on a substrate, forming a middle metal layer having a diffusion coefficient smaller than the diffusion coefficient of said lower and upper metal layers between said lower metal layer and said upper metal layer for preventing an alloy from forming between said lower and upper metal layers, and etching said upper middle and lower metal layer whereby a tapered pattern is formed on said lower metal layer, said lower metal layer is made of chromium, said upper metal layer is made of aluminum, and said middle metal layer is made of chromium oxide.

4. The method for taper etching comprising the steps of laminating a lower metal layer and an upper metal layer having an etching rate different from the etching rate of said lower metal layer on a substrate, forming a middle metal layer having a diffusion coefficient smaller than the diffusion coefficient of said lower and upper metal layers between said lower metal layer and said upper metal layer for preventing an alloy from forming between said lower and upper metal layers, and etching said upper middle and lower metal layer whereby a tapered pattern is formed on said lower metal layer, said lower metal layer is made of aluminum, said upper metal layer is made of titanium, and said middle metal layer is made of aluminum oxide.

5. The method for taper etching comprising the steps of laminating a lower metal layer and an upper metal layer having an etching rate different from the etching rate of said lower metal layer on a substrate, forming a middle metal layer having a diffusion coefficient smaller than the diffusion coefficient of said lower and upper metal layers between said lower metal layer and said upper metal layer for preventing an alloy from forming between said lower and upper metal layers, and etching said upper middle and lower metal layer whereby a tapered pattern is formed on said lower metal layer, said lower metal layer is made of aluminum, said upper metal layer is made of molybdenum, and said middle metal layer is made of a barrier metal.

6. The method for taper etching as set forth in claim 5 wherein said barrier metal in made of titanium.

7. A method for taper etching comprising the steps of forming an aluminum layer on a substrate, forming an aluminum oxide layer on said aluminum layer, forming a molybdenum layer on said aluminum oxide layer, forming a resist pattern on said molybdenum layer, removing said molybdenum and aluminum oxide layers using said resist pattern as a mask, and forming a tapered cross-sectional pattern of said aluminum layer by etching using said molybdenum and aluminum oxide layers as masks.

8. The method for taper etching as set forth in claim 7 wherein said aluminum oxide layer has a thickness of 10 angstroms.

* * * * *